(12) United States Patent
Oki et al.

(10) Patent No.: US 7,945,169 B2
(45) Date of Patent: May 17, 2011

(54) OPTICAL TRANSCEIVER WITH A PLURALITY OF OPTICAL SUBASSEMBLIES ELECTRICALLY CONNECTED BY INTEGRATED FPC BOARD WITH A SUBSTRATE

(75) Inventors: Kazushige Oki, Yokohama (JP); Osami Kasai, Yokohama (JP); Hideaki Kamisugi, Yokohama (JP); Hiromi Kurashima, Yokohama (JP); Yasunori Murakami, Yokohama (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 702 days.

(21) Appl. No.: 11/905,761

(22) Filed: Oct. 3, 2007

(65) Prior Publication Data
US 2009/0052898 A1    Feb. 26, 2009

(30) Foreign Application Priority Data
Oct. 4, 2006 (JP) ................................. 2006-273068

(51) Int. Cl.
G02B 6/42 (2006.01)
G02B 6/26 (2006.01)
G03B 7/08 (2006.01)
H04B 10/00 (2006.01)
H05K 1/11 (2006.01)
H01L 23/48 (2006.01)

(52) U.S. Cl. .......... 398/135; 398/138; 398/139; 385/92; 385/47; 174/254; 257/786

(58) Field of Classification Search .................. 398/135, 398/138, 139; 439/77
See application file for complete search history.

(56) References Cited

U.S. PATENT DOCUMENTS

| 4,227,788 | A | * | 10/1980 | Shimizu et al. | 396/542 |
| 5,204,806 | A | * | 4/1993 | Sasaki et al. | 361/749 |
| 5,424,586 | A | * | 6/1995 | Hattori et al. | 307/10.1 |
| 7,416,353 | B2 | * | 8/2008 | Yoshikawa et al. | 385/92 |
| 7,597,421 | B2 | * | 10/2009 | Silverbrook | 347/49 |
| 2003/0063844 | A1 | * | 4/2003 | Caracci et al. | 385/24 |
| 2003/0123802 | A1 | * | 7/2003 | Richard et al. | 385/47 |
| 2004/0101247 | A1 | | 5/2004 | Chen et al. | |
| 2004/0208601 | A1 | * | 10/2004 | Tan et al. | 398/135 |
| 2005/0180754 | A1 | * | 8/2005 | Mizue et al. | 398/135 |
| 2006/0032665 | A1 | * | 2/2006 | Ice | 174/254 |
| 2006/0077778 | A1 | * | 4/2006 | Tatum et al. | 369/44.11 |

(Continued)

OTHER PUBLICATIONS

Shih, Ying-Ching et al., "Development of Star-Shaped Four-Channel CWDM Optical-Subassembly Module", 2005 Electronic Components and Technology Conference, pp. 1343-1348.

Primary Examiner — Ken N Vanderpuye
Assistant Examiner — Oommen Jacob
(74) Attorney, Agent, or Firm — Venable LLP; Michael A. Sartori; Steven J. Schwarz (57) ABSTRACT

The present invention provides an optical transceiver with a function of the wavelength division multiplexing. The transceiver includes a receiver optical unit, a transmitter optical units and a substrate. Both optical unit includes a plurality of receiver optical subassemblies (ROSAs) or a plurality of transmitter optical subassemblies (TOSAs) and a plurality of wavelength selective filters. The ROSAs or the TOSAs in respective optical units is electrically connected with the circuit on the substrate by the flexible printed circuit (FPC) board with a plurality of branches, each connected to the ROSAs or the TOSAs, and a connecting portion fixed to the substrate.

7 Claims, 10 Drawing Sheets

U.S. PATENT DOCUMENTS

| | | | |
|---|---|---|---|
| 2006/0088255 A1* | 4/2006 | Wu et al. | 385/92 |
| 2006/0118972 A1* | 6/2006 | Baek et al. | 257/786 |
| 2006/0133739 A1* | 6/2006 | Kim et al. | 385/88 |
| 2006/0165341 A1* | 7/2006 | Yan et al. | 385/8 |
| 2006/0213682 A1* | 9/2006 | Moon et al. | 174/255 |
| 2006/0228922 A1* | 10/2006 | Morriss | 439/171 |
| 2009/0023398 A1* | 1/2009 | Boyle | 455/90.2 |

* cited by examiner

FIG. 5A  FPC for ROSA

FIG. 5B  FPC for TOSA

OPTICAL TRANSCEIVER WITH A PLURALITY OF OPTICAL SUBASSEMBLIES ELECTRICALLY CONNECTED BY INTEGRATED FPC BOARD WITH A SUBSTRATE

BACKGROUND OF THE INVENTION

1. Field of the Invention

The present invention relates to an optical transceiver, in particular, the invention relates to an optical transceiver with a function of a wavelength division multiplexing (hereafter denoted as WDM).

2. Relater Prior Art

A new type of an optical transceiver has been proposed in which a plurality of receiver optical subassemblies (hereafter denoted as ROSA) and transmitter optical subassemblies (hereafter denoted as TOSA) are installed, and such transceiver may realize the WDM system with relatively lower cost. This type of the optical transceiver is replaceable to the host system arranging a plurality of optical transceivers each providing single optical channel.

The United States Patent published as 2003/0063844 has disclosed an optical transceiver built in two receivers (Rx), single transmitter (Tx) and wavelength selective filters that transmit light with specific wavelength range and reflects light with wavelengths out of this specific range. This optical transceiver has the WDM function by dividing input and output light into two or more beams by the filters. A United States Patent published as 2004/0101247A has disclosed another type of an optical transceiver that builds in four receivers or four transmitters and wavelength selective filters. These conventional transceivers are unfit to a standard transceiver, because the optical arrangement in those transceivers are primary determined by the arrangement or the function of the wavelength selective filter.

The United States Patent published as 2006/0088255A has disclosed an optical transceiver that builds four transmitters, four receivers and some wavelength selective filters within a housing with dimensions following the standard, such as XENPAK and X2, both of which are ruled by IEEE 802.3ae standard.

In such optical transceiver with a plurality of receivers, transmitters and filters, it is necessary to arrange those components in compact to apply the standard housing, which makes the optical coupling between components complex and the electrical connection between transmitters and receivers with the electronic circuit that is also installed within the standard housing has to be restricted.

Figure 10:
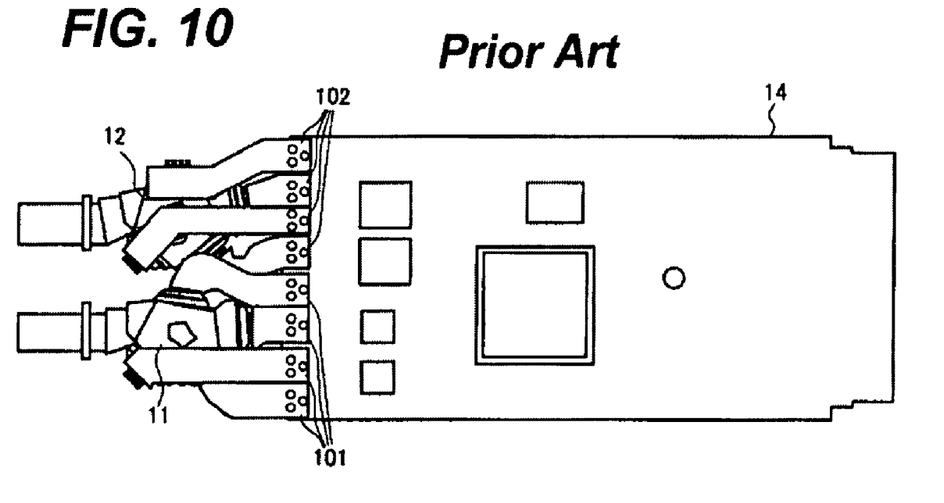
FIG. 10 illustrates a conventional arrangement to electrically connect the optical units with the substrate by the FPC board.

FIG. 10 illustrates a conventional electrical connection within the optical transceiver, in which the electrical connection is performed between optical components, namely four receivers and four transmitters, with the circuit board on which the electronic circuit is installed thereon. Each receiver or transmitter is connected to the circuit board with a flexible printed circuit board (hereafter denoted as FPC board), 101 or 102, that extends from the edge of the circuit board to respective optical devices. However, because each optical device is fixed to the optical unit, 11 or 12, with a specific angle independent of each device, the drawing of the FPC boards becomes quite complex, which not only degrades the reliability but also prolongs the manufacturing time.

The present invention is to provide an optical transceiver with a simplified electrical connection of a plural receivers and transmitters with the electronic circuit board.

SUMMARY OF THE INVENTION

An optical transceiver of the present invention has a feature that the transceiver includes a plurality of optical subassemblies and a substrate. The transceiver converts a plurality of optical signals into a plurality of electrical signals, or a plurality of electrical signals into a plurality of optical signals, where the optical signals each has a specific wavelength different from each other. The substrate installs an electronic circuit thereon. In the optical transceiver of the invention, the optical subassemblies are electrically connected to the substrate only with single FPC board.

The FPC board of the invention provides a center portion, a plurality of branches, and a unified portion. The center portion has substantially polygonal shape that follows the horizontal section of an optical unit to which the optical subassemblies are assembled. The optical unit assembles the optical subassemblies in each side of the polygonal section and the wavelength selective filters in an inner wall of an opening formed in the center portion of the optical unit. Each branch of the FPC board, which extends from one of the polygonal edge of the center portion, connects one of the optical subassemblies to the substrate by attaching the unified portion of the FPC board thereto.

Because the plurality of subassemblies is electrically connected to the substrate with only one FPC board having branches corresponding to each subassemblies and the unified portion attached to the substrate, the drawing of the FPC board becomes simple and neat, which may enhance the reliability and reduce the manufacturing cost.

The FPC board of the invention may provide creases in respective branches to make it simple to bend the FPC board to connect the end of the branch with the subassembly, and each crease may accompany with a notch in the edge of the FPC board. The FPC board may further provide an end in each branch with a rigid substrate attached thereto, where the end of the branch and the rigid substrate provide via holes, into which the lead pins of the optical subassembly are inserted. The shape of the via hole may be an extended oval bent along a circle whose center is substantially same as the center position of the lead pins. This arrangement of the end of the branch, in particular, the shape and positions of the via holes in the end, may enhance a tolerance of the assembly between the FPC board and the optical subassembly.

BRIEF DESCRIPTION OF DRAWINGS

FIGS. 7A and 7B illustrate the process to assemble the intermediate produce, which includes the optical unit, the receiver or transmitter subassemblies, the sleeve member and the FPC board, with the substrate by respective FPC boards, FIG. 7A illustrates the intermediate product viewed from the upper, while, FIG. 7B illustrates the product viewed from the lower;

DETAILED DESCRIPTION OF THE INVENTION

Figure 1:
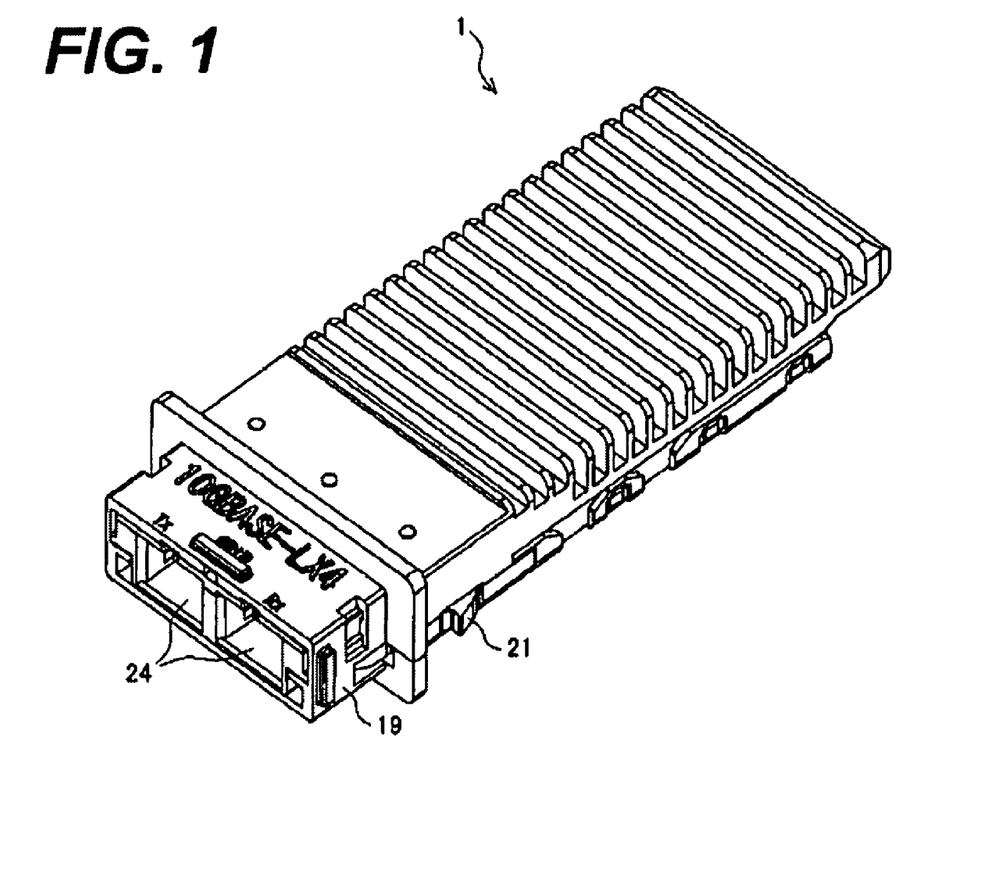
FIG. 1 is an appearance of the optical transceiver according to the present invention.

FIG. 1 is an appearance of an optical transceiver according to an embodiment of the present invention. The transceiver 1 has a shape following the standard of the XENPAK or the X2, and is to be inserted into an opening provided in the faceplate of the host equipment. The transceiver 1 provides a latch tab 21 in the sides, which mates with an opening formed on a metal rail on the substrate of the host equipment. This mating of the latch tab 21 with the opening sets this transceiver within the host equipment.

On the front end of the transceiver is provided with an optical receptacle 24 into which an external optical connector is to be inserted. In the description below, the front of the transceiver 1 is a side where the receptacle is formed, while the rear thereof is a side to be inserted into the opening of the face plate of the host equipment. The transceiver 1 further provides a grip 19 that releases the latching between the latch tab 21 with the opening of the rail by sliding it frontward and backward around the optical receptacle 24.

Figure 2:
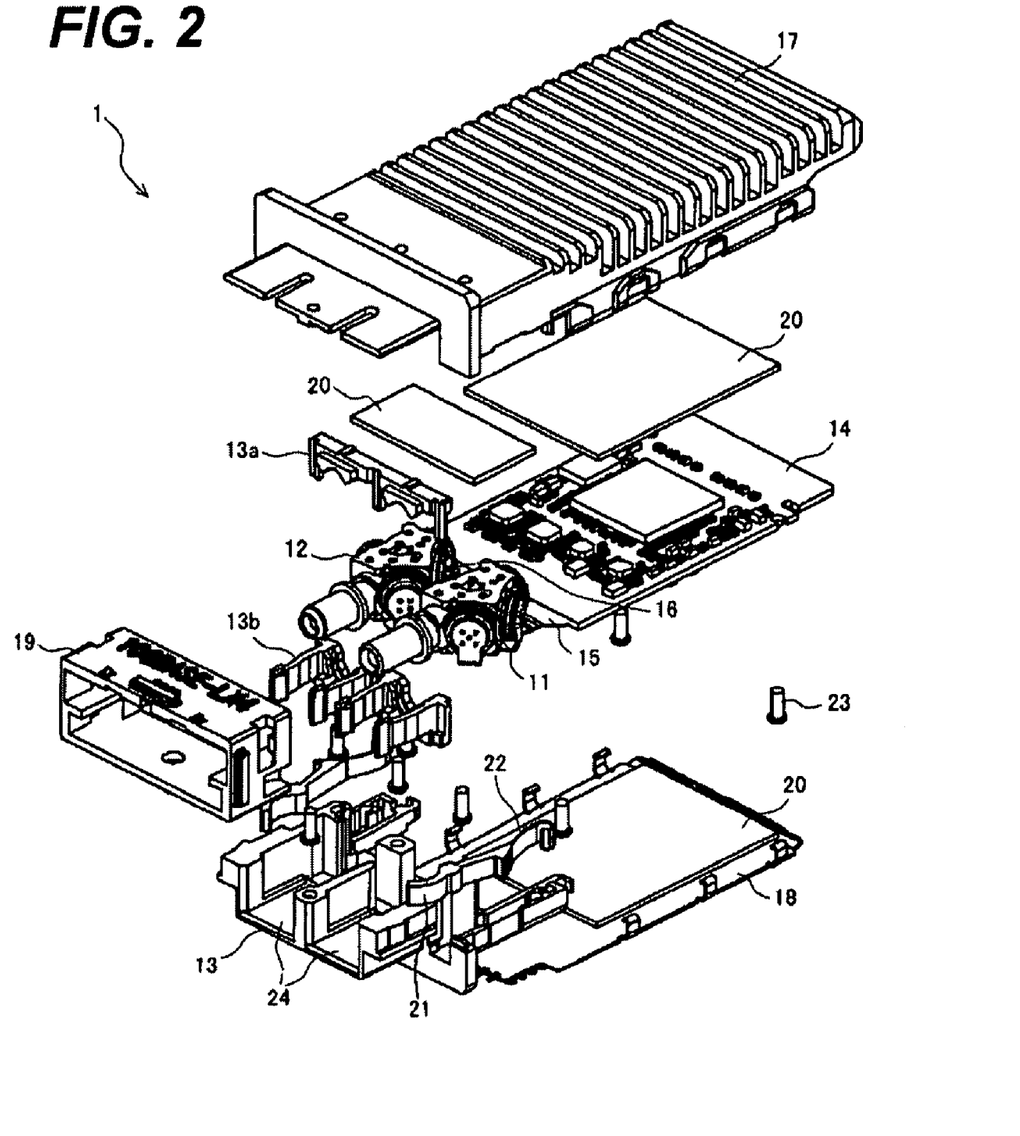
FIG. 2 is an exploded view of the optical transceiver shown in FIG. 1.

The transceiver 1 has a function to receive a plurality of optical signals each having a different wavelength and to convert the optical signals into corresponding electrical signals or to convert a plurality electrical signals into corresponding optical signals each having different wavelengths and to transmit these optical signals. The transceiver 1 has a mechanical arrangement shown in FIG. 2. FIG. 2 is a exploded view of the transceiver 1. The transceiver 1 includes a receiving optical unit 11, a transmitting optical unit 12, a lower housing to install these two units, 11 and 12, a substrate 14 to install an electronic circuit, and two FPC boards, 15 and 16, each connecting the optical unit, 11 or 12, to the substrate 14. The receiving optical unit 11 includes a plurality of ROSAs, where the embodiment shown in FIG. 2 includes 4 ROSAs, while the transmitting optical unit 12 includes a plurality of TOSAs, where the embodiment includes 4 TOSAs.

The transceiver further provides an upper housing 17 and a cover 18, which put the substrate 14 therebetween, the grip to release the transceiver 1 from the rail, and some heat-dissipating sheets 20 to conduct heat generated by the electronic circuit on the substrate 14 and by two optical units to the outside of the transceiver 1. The latch tab 21 is pushed out by the leaf spring 22 from the body of the transceiver 1 when the transceiver 1 is free from the rail.

The fixing bar 13a fixes two optical units, 11 and 12, to the lower housing 13. The front end of the optical units, 11 and 12, extrudes into the optical receptacle 24 to mate with the external optical connector. FIGS. 1 and 2, omit the external optical connector. The upper and lower housings define the dimensions of the optical receptacle so as to follow the standard of the optical connector, for instance, the standard of the SC-type connector, to be inserted into the receptacle 24. The lower housing 13 provides the SC-latch tab 13b with a projection in the front end thereof to be latched with the SC-type optical connector.

The latch tab 21 and the leaf spring 22 integrally built together show a function to latch the transceiver 1 with the rail system provided on the host equipment by pushing the latch tab outward with the leaf spring 22. Screws 23 assemble the lower housing 13 with the upper housing so as to put the substrate 14 therebetween. The cover 18 is fit with the upper housing 17.

Figure 3:
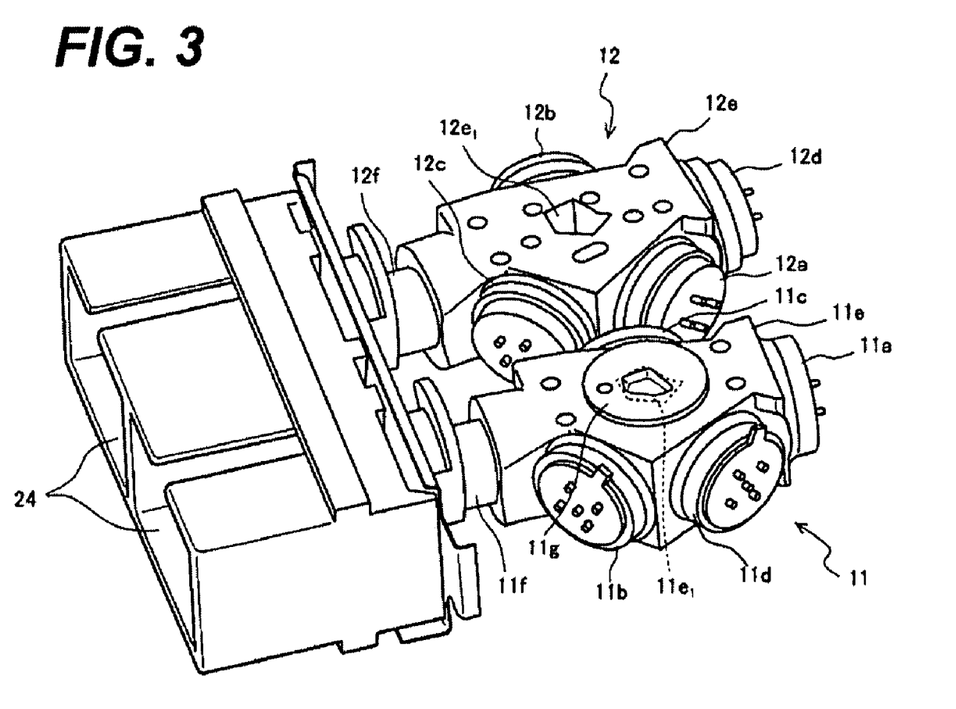
FIG. 3 is a part drawing to describe the optical units of the optical transceiver according to the invention.

FIG. 3 illustrates the optical units, 11 and 12, of the present embodiment. FIG. 3 only illustrates the optical receptacle 24 comprised of the upper and lower housings, 17 and 13, and two optical units, 11 and 12. Each optical unit, 11 or 12, has an optical blocks, 11e or 12e, with a polygonal shape. The optical block, 11e or 12e, assembles four ROSAs, 11a to 11d, or four TOSAs, 12a to 12d, in respective walls of the polygonal that face the wavelength selective filters. One side wall of the polygonal block, 11e or 12e, protrudes the sleeve member, 11f or 12f, whose tip end extrudes into the receptacle 24 to optically couple with the optical connector.

Figure 4:
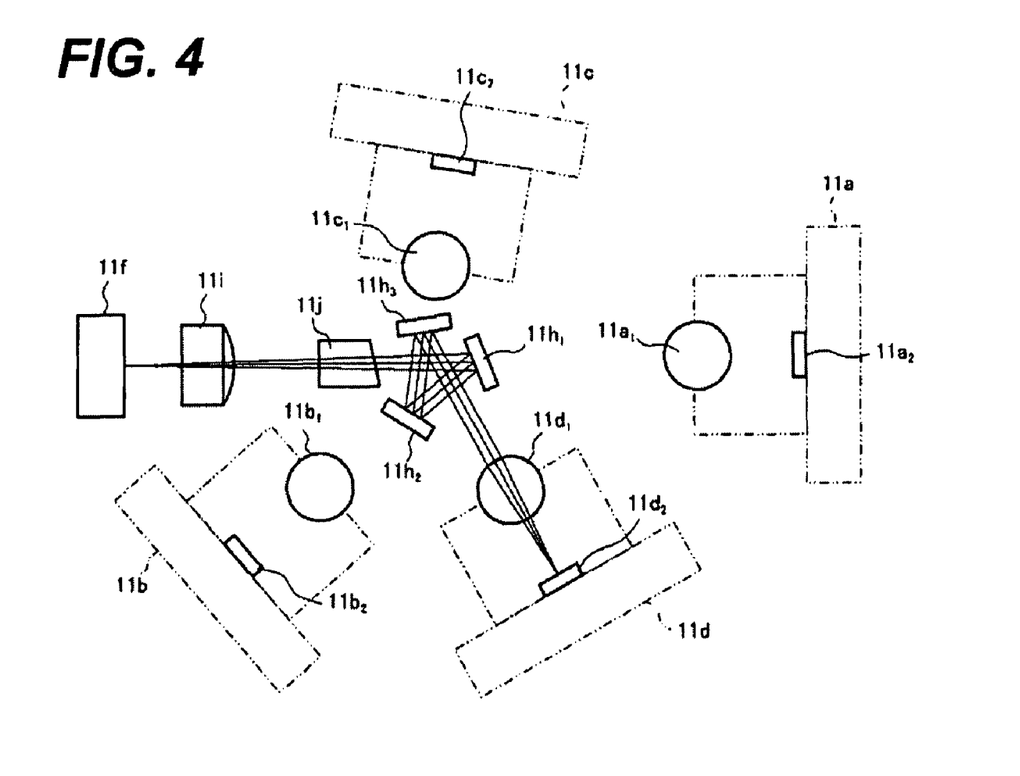
FIG. 4 schematically illustrates the optically coupling arrangement within the optical unit according to the embodiment of the invention.

In a center of each polygonal block, 11e or 12e, is provided with an opening, $11e_1$ or $12e_1$, with four wavelength selective filters, refer to symbols $11h_1$ to $11h_3$ in FIG. 4, attached to respective inner surfaces of this opening, $11e_1$ or $12e_1$. For the optical unit 11 which divides the optical signals into four beams with different wavelengths from each other, the signal light containing wavelengths $\lambda_1$~$\lambda_4$ and received via the sleeve member 11f is divided into four beams, 11a to 11d, by the wavelength selective filter in the opening $11e_1$. The optical unit 12 mixes optical beams with wavelengths $\lambda_a$~$\lambda_d$ each emitted from the TOSA 12a to 12d by the wavelength selective filter in the opening $12e_1$ and emits thus mixed optical signal from the sleeve member 12f.

In FIG. 3, the lid 11g covers the aperture $11e_1$ of the optical block 11e to protect the aperture; in particular, the wavelength selective filter within the aperture from the dust or the contamination, a similar lid may cover the aperture $12e_1$ of the other optical block 12e. Moreover, another lid may cover the aperture in the other side of the optical block, 11e or 12e, not illustrated in FIG. 3. The optical units, 11 and 12, may further provide a primary lens and an isolator as shown in FIG. 4. The primary lens converts the optical beam transmitting the sleeve member 11f into a substantially parallel beam in the optical unit 11, while, it concentrates the optical beam transmitting the isolator onto the sleeve member 12f, specifically, a coupling fiber installed within the sleeve member 12f.

FIG. 4 schematically illustrates the optical arrangement within the optical unit. For the optical unit 11, the lens 11i converts the optical beams, which included a plurality of optical signals with different wavelengths from each other, input from the sleeve member 11h into substantially parallel beams. The isolator 11j transmits the parallel beams toward the first wavelength selective filter $11h_1$. The filter $11h_1$ reflects the beams with wavelengths except for $\lambda_1$ toward the second filter $11h_2$, while transmits the only beam whose wavelength is $\lambda_1$ toward the first ROSA 11a. The beam with the wavelength $\lambda_1$ is received by the PD $11a_2$ within the first ROSA 11a after it is concentrated by the lens $11a_1$ of the ROSA 11a.

The second filter $11h_2$ transmits the only beam whose wavelength is $\lambda_2$, while reflects other beam the wavelengths of which is except for $\lambda_2$ toward the third filter $11h_3$. The beam with the wavelength $\lambda_2$ advances to the second ROSA 11b, and is detected by the PD 11b in the second ROSA 11b after passing through the lens $11b_1$. The third filter $11h_3$ passes the only beam whose wavelength is $\lambda_3$ toward the third ROSA 11c, while reflects other beams toward the fourth ROSA 11d.

Although FIG. 4 omits the filter to be placed in front of the fourth ROSA 11d, it may be preferable to apply the fourth filter that only transmits the beam whose wavelength is $\lambda_4$. The beam with the wavelength $\lambda_3$, which is transmitted through the third filter $11h_3$, advances to the third ROSA 11c, concentrated by the lens $11c_1$, and is detected by the PD $11c_2$ in the third ROSA 11c. The beam with the wavelength $\lambda_4$, which is transmitted through the fourth filter, advances to the fourth ROSA 11d, concentrated by the lens $11d_1$, and is detected by the PD $11d_2$ in the fourth ROSA 11d.

Thus, the first to fourth ROSAs, 11a to 11d, may detect beams with wavelengths $\lambda_1$ to $\lambda_4$, respectively. In the case of the transmitting optical unit 12, the beams each emitted from respective LDs in the TOSAs, 12a to 12d, and having wavelengths $\lambda_a$ to $\lambda_d$, advance to directions opposite to those explained for the receiving optical unit 11, and the optical unit 12 emit the single beam multiplexed with wavelengths $\lambda_a$ to $\lambda_d$ from the sleeve member 12f.

Figure 5A:
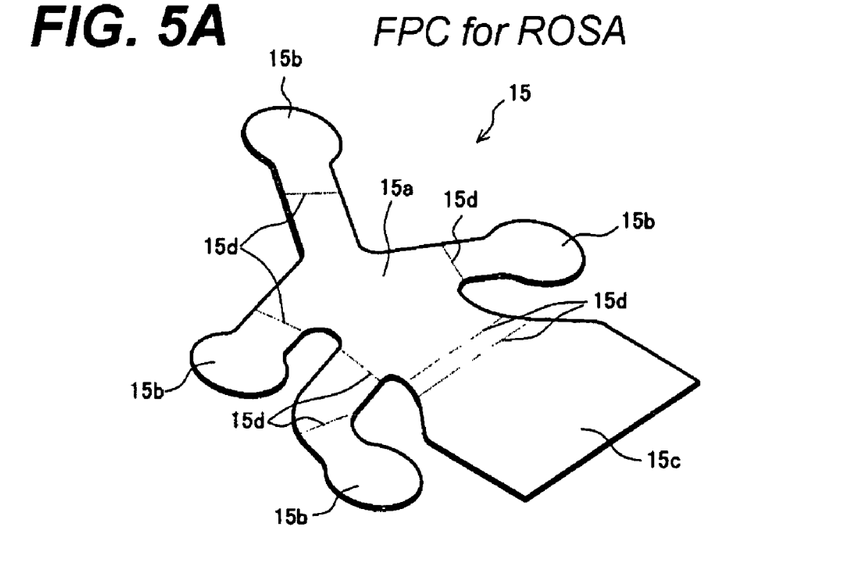
FIGS. 5A and 5B illustrate examples of the FPC board applicable to the receiver optical unit and the transmitter optical unit shown in FIG. 3.
Figure 5B:
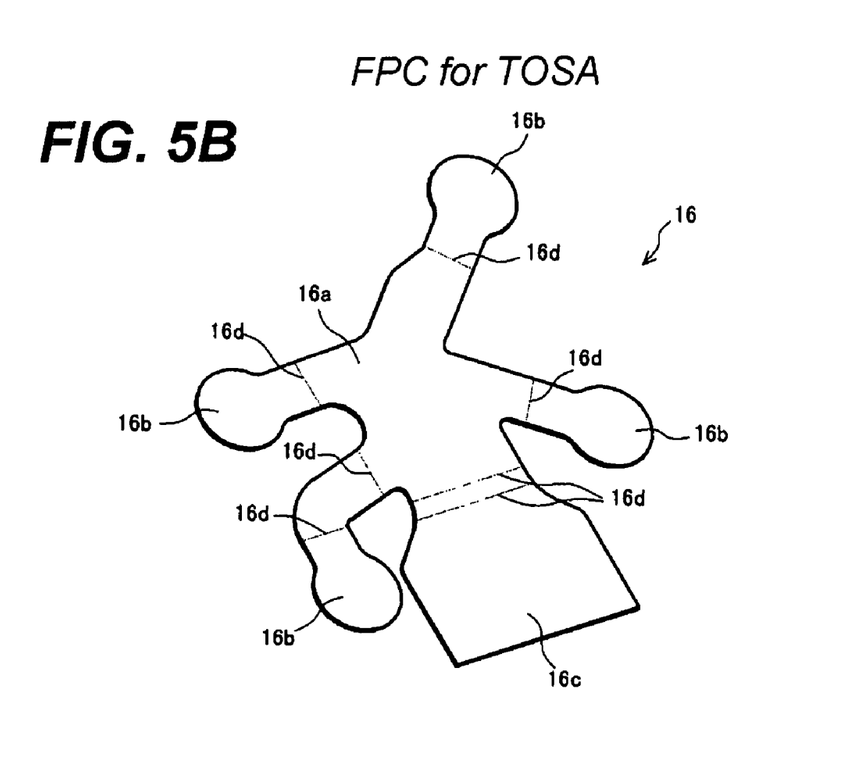
Figure 7A:
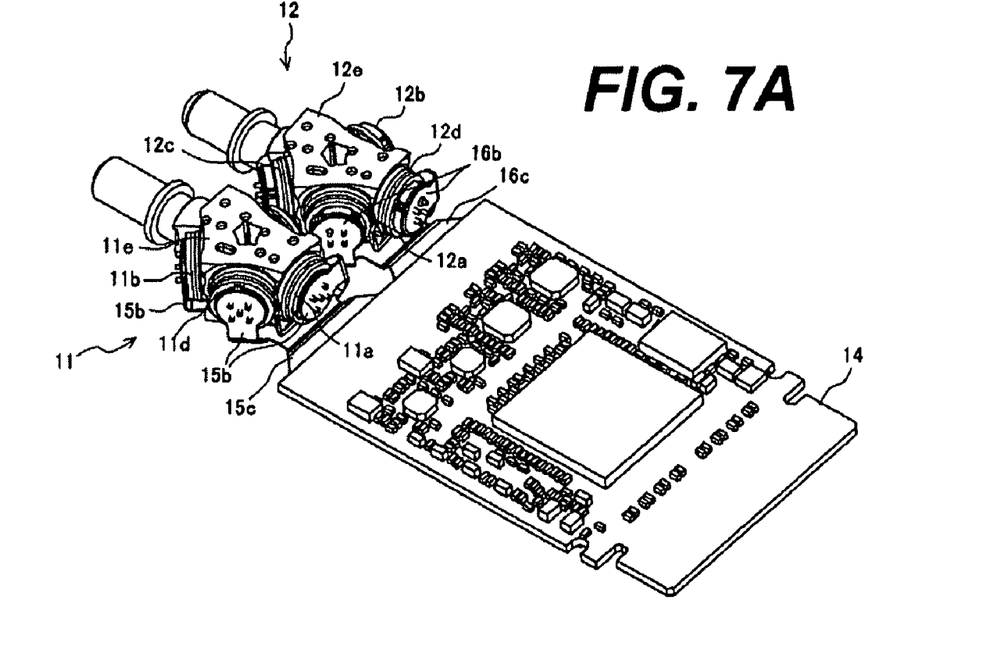
Figure 7B:
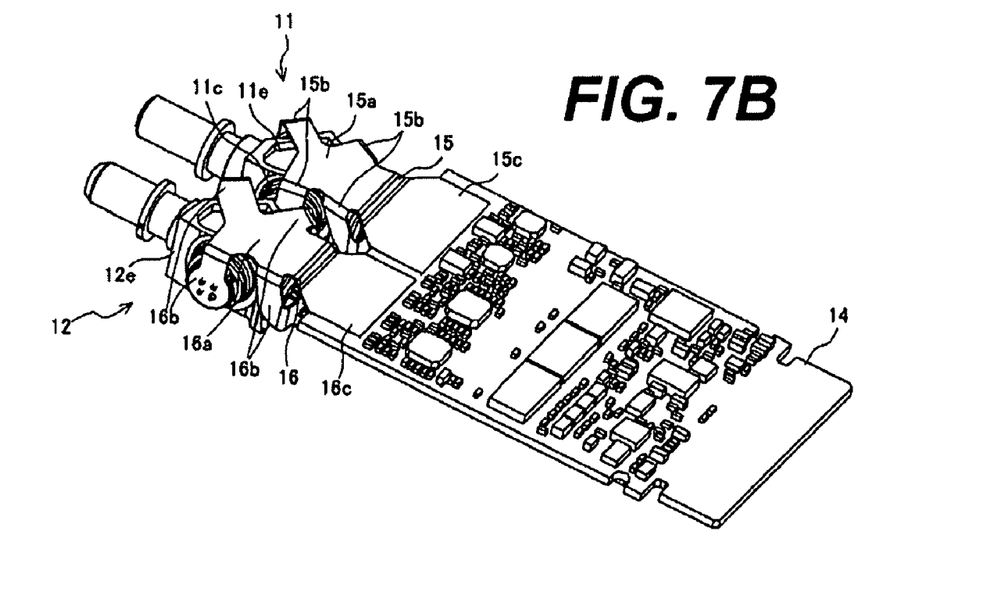

Next, the detail of the FPC substrate will be described. The FPC board electrically connects the TOSAs/ROSAs assembled with each optical unit 11 (12) to the substrate. FIG. 5A illustrates an example of the FPC substrate 15 that traces the outer shape of the receiving optical unit 11 shown in FIG. 3, while, FIG. 5B illustrates an exemplary FPC substrate 16 tracing the shape of the transmitting optical unit 12. FIG. 7A illustrates the optical units, 11 and 12, viewed from the upper side, while, FIG. 7B illustrates the optical units, 11 and 12, viewed from the bottom side, where the optical units, 11 and 12, are assembled with the ROSAs, 11a to 11d, and TOSAs, 12a to 12d, and respective ROSAs and TOSAs are electrically connected to the substrate 14 with the FPC boards, 15 and 16. The FPC board 15 (16) has a center portion 15a (16a) which traces the outer shape of the optical unit 11 (12). Each FPC board, 15 (16) provides four branches 15b (16b) each extending from the center portion 15a (16a) toward the ROSA, 11a to 11d, or toward the TOSA, 12a to 12d. The end of each branch 15b (16b) forms a round to follows the outer shape of the ROSA, 11a to 11d, and that of the TOSA, 12a to 12d. The FPC board 15 (16) further provides a unified portion, 15c (16c) where the interconnecting patterns electrically connected each ROSAs, 11a to 11d, or TOSAs, 12a to 12d, are corrected.

The center portion 15a (16a) has a polygonal shape that reflects the plane shape of the optical block 11e (12e) of each optical unit 11 (12). The branches 15b (16b) and the unified portion 15c (16c) are brought out from respective sides of this polygonal center portion 15a (16a). Thus, the FPC board 15 (16) is formed so as to fit the outer shape of the optical block 11e (12e).

Each branch 15b (16b) provides a rigid substrate in the round end thereof to receive a plurality of lead pins of respective ROSAs, 11a to 11d by via holes corresponding to the lead pins. These lead pins of each ROSA, 11a to 11d, transmit two signals, Sig+ and Sig−, that is converted from the current signal output from the PD into voltage forms complementary to each other, a power supply Vcc to provide an electric power to the pre-amplifier in the ROSA, another power supply Vpd to bias the PD, and the ground lead. The via holes in each rigid substrate correspond to these five lead pins.

Each branches 16b of the other FPC board 16 for the TOSA 12a to 12d provide a rigid substrate that forms a plurality of via holes to receive three or four lead pins of the TOSA 12a to 12d. Three lead pins correspond to the anode lead LD+, the cathode lead LD− and the ground in the three-lead configuration, while an additional lead to bring out the monitor signal Mon may further provide in the four-lead configuration. The lead pins, LD+ and LD−, supply the driving current to the LD, and the additional lead Mon is for taking out the monitor signal that reflects the output optical power of the LD in the TOSA.

The rigid substrates attached in the round end of respective branches 15b (16b) of the FPC board 15 (16) is to support the FPC board 15 (16) mechanically, because the FPC board is flexible and has less mechanically stiffness to receive the plurality of lead pins.

The end of the unified portion 15c (16c) of the FPC board 15 (16) forms a plurality of pads to be electrically connected to the pads provided on the substrate 14. The pads formed on the substrate 14 are those extended from the connecting pattern on the substrate 14. The count of the pads in the FPC board 15c (16c) are at least 20 pads (=5 pins×4 ROSAs) for the FPC board 15, while they are at least 12 pads (=3 pins×4 TOSAs) for the board 16. It is preferable from the view point of the crosstalk noise that, on the FPC board 11 (12), the ground patterns in addition to the signal lines and the poser supply lines in respective ROSAs, 11a to 11d, or TOSAs, 12a to 12d, are independent to each other, namely, grouped by each TOSA and electrically isolated to each other. These pads including the ground pads may be arranged in a plurality of arrays in the unified portion 15c (16c).

The center portion 15a (16a) of the FPC board 15 (16) is placed on the bottom of the block 11a (12a) of the optical unit 11 (12), and respective branches 15b (16b) are bent at the end of the optical block 11e (12e) to face the rigid substrate provided in the round end of each branch 11b (12b) to each ROSAs, 11a to 11d, or TOSAs, 12a to 12d, which enables the lead pins of the ROSA or the TOSA to insert through the via holes and to be soldered with the interconnecting patterns on the FPC board 11 (12). Similarly, the pads in the unified portion 15c (16c) are soldered with the pads on the substrate 14.

The FPC board 15 (16) provides creases 15d (16d) in positions corresponding to the edge of the polygonal optical block 11 (12), as shown in FIGS. 5A and 5B to facilitate to bend each branch 15b (16b) and to solder the unified portion 15c (16c) with the substrate 14.

Figure 6:
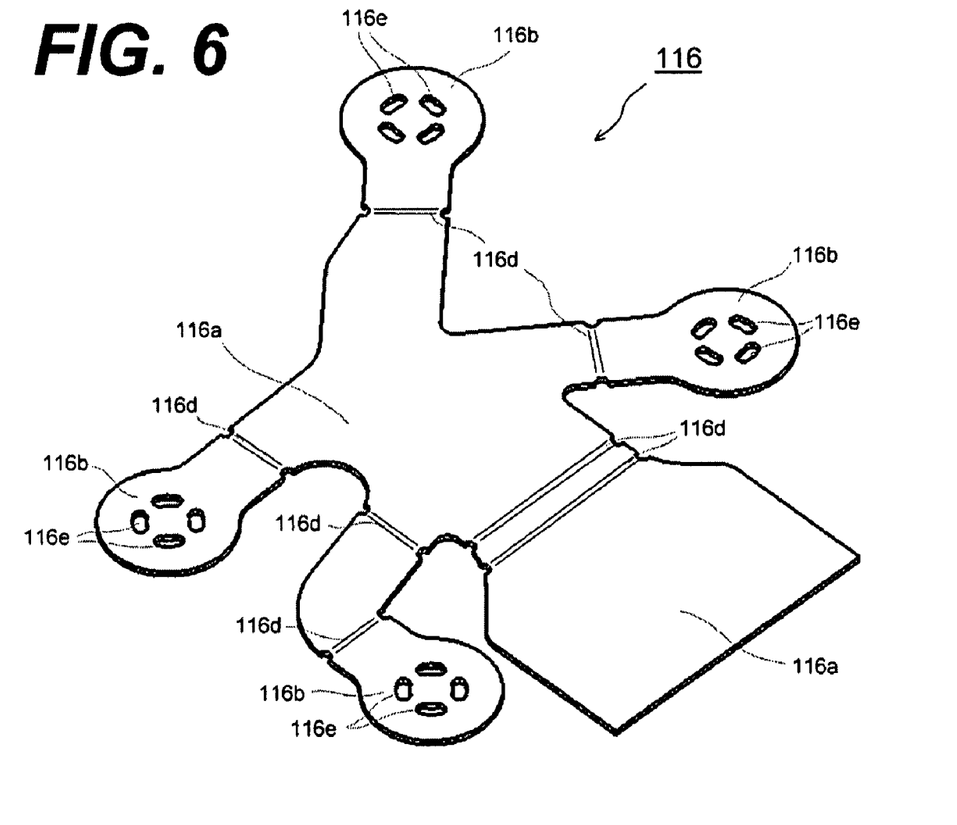
FIG. 6 illustrates one modification of the FPC board for the transmitter optical unit.

FIG. 6 illustrates a modification of the FPC board 116 for the transmitting optical unit 12. This FPC board 116 also provides four branches 116b with the round end, and each round end provides four via holes 116e corresponding to the lead pins of the TOSAs 12a to 12d. The via holes 116e in this modified FPC board 116 have a broad bean shape, namely, an extended oval bent along a circle whose center is substantially same as the center of the lead pins. The ROSAs 11a to 11d and the TOSAs 12a to 12d have a co-axial shape and the lead pins thereof have circular positions with the center, which is substantially same arrangement of that of the via holes in the FPC board 116. Because the lead pins inserting through this oval hole have the tolerance in their positions, the lead pins may be released from the stress even after they are soldered with the FPC board 116. Moreover, the FPC board 116 shown in FIG. 6 further provides notches in the end of each crease, which further facilitate to bend the branches 116b and to release the lead pin soldered with this FPC board 116 form the stress.

Thus, the FPC board with a plurality of branches connects each ROSA or TOSA to the substrate and the FPC board follows the outer shape of the optical unit where the ROSA or TOSA is assembled to, the inner arrangement of the transceiver may be simplified even the transceiver installs a plurality of ROSAs or TOSAs. Next, the process to assemble the transceiver, in particular, the assembly of the optical unit with the lower and upper housings will be described in detail as referring to FIGS. 7 to 9.

(Assembly of the Optical Unit)

First, the optical unit 11 (12) installs the ROSAs, 11a to 11d, and the TOSAs, 12a to 12d, in corresponding side walls of the unit 11 (12). In this process, the sleeve member, 11f or 12f, is also installed in one of the side walls of the optical unit 11 (12). Subsequently, wavelength selective filters are set within the inner wall of the center aperture $11e_1$ ($12e_1$) of the unit. The YAG laser welding fixes the ROSAs 11a to 11d, or TOSAs 12a to 12d, to each unit 11 (12). In this welding process, the rotation angle of the ROSA or the TOSA with respect to their optical axis should be noticed. The angle of the ROSA or the TOSA, in particular, the positions of their lead pins, is necessary to correspond to the position of the holes provided in the FPC substrate 15 (16). Some types of the alignment mark in the optical unit 11 (12) and in the ROSA or the TOSA will enhance the preciseness of the rotation angle of the ROSA or the TOSA, or, the holes with the broad beans aforementioned will expand the tolerance of the rotation angle of the ROSA or the TOSA.

(Connecting the Optical Unit with the Substrate by FPC Board)

Next, the lead pins of the ROSAs 11a to 11d, and those of the TOSAs 12a to 12d, are soldered with the FPC board. Inserting the lead pins of the ROSAs 11a to 11d and TOSAs 12a to 12d into the via holes in each FPC boards 15 and 16 and soldering the lead pins to the interconnecting patterns on the FPC board, an assembly of the optical unit 11 (12) with the plurality of the ROSAs 11a to 11d and with the FPC board 15 (16) may be obtained. Subsequently, the unified portion 15c (16c) of the FPC board 15 (16) are soldered in the pads thereof with the pads on the substrate 14 to get an intermediate product shown in FIGS. 7A and 7B, where FIG. 7A is a top view of the intermediate product while FIG. 7B is a bottom view of the product. It is preferable to bend the FPC board 15 (16), specifically, the branches 15b (16b) of the FPC board 15 (16) at the crease to facilitate the inserting the lead pins into the holes and to solder the lead pin with the interconnecting patterns on the FPC board 15 (16).

As shown in FIGS. 5A and 5B, and FIG. 6, one of the branches whose position is opposite to the position where the sleeve member 11f (12f) is set has two creases 15d, 16d or 116d. As shown in FIG. 7A, this branch is first bent upside at the crease tracing the outer shape of the polygonal block 11e or 12e and is secondly bent at the crease provided in the round end side of branch to receive the lead pins of the ROSAs and those of the TOSAs, because the unified portion, 15c or 16c, of the FPC board 15 (16) overlaps and hides the lead pins of the ROSA 11a and those of the TOSA 12d.

Moreover, the center portion, 15a or 16a, of the FPC board, 15 or 16, may provide a double-sided adhesive tape to fix the FPC board, 15 or 16, to the optical block, 11e or 12e, respectively. To align the center portion, 15a or 16a, with the polygonal shape with the optical block, 11e or 12e, also with the polygonal shape may facilitate the manufacturing process of the optical unit, 11 or 12, with the FPC board, 15 or 16.

(Assembly of the Intermediate Product with the Lower Housing)

Figure 8A:
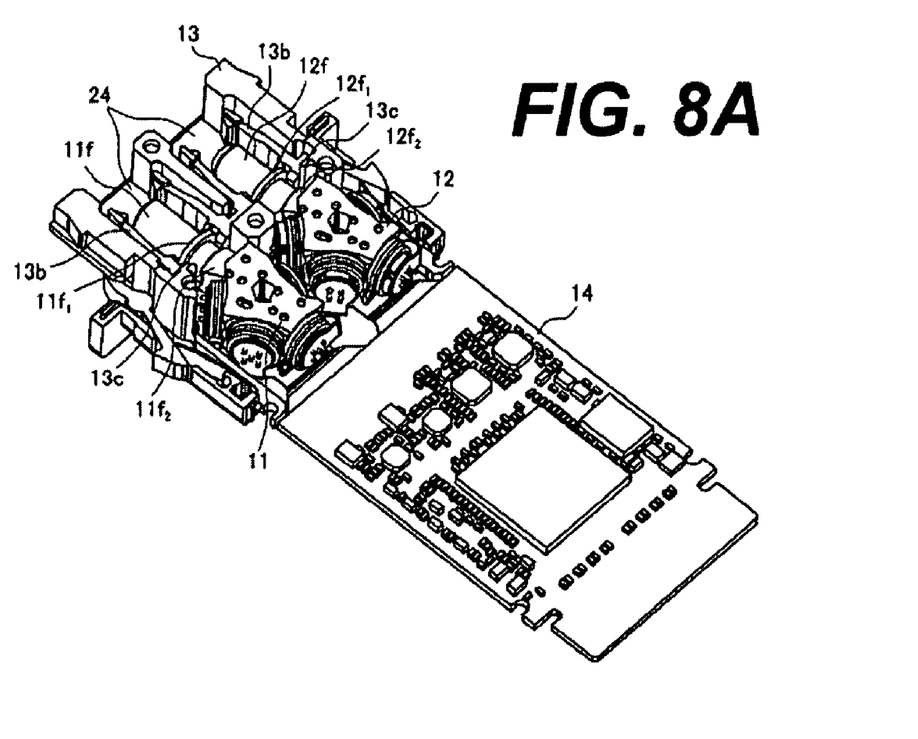
FIGS. 8A and 8B show the process when the intermediate product is installed on the lower housing.
Figure 8B:
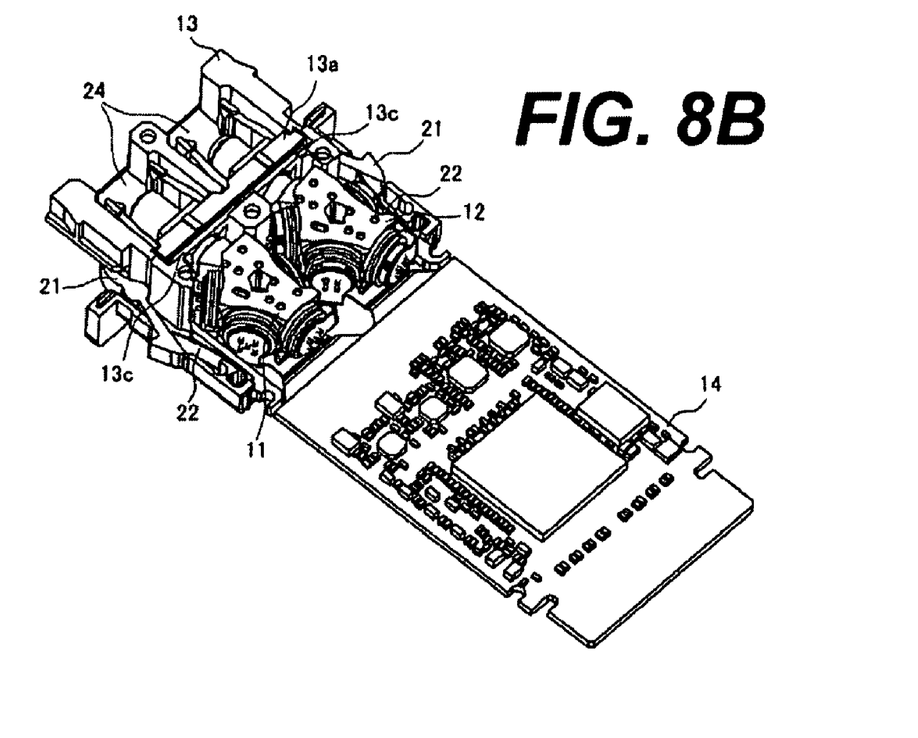

Next, thus assembled intermediate product with the optical units, 11 and 12, the ROSAs 11a-11d and the TOSAs 12a-12d, and the substrate 14 is installed within the lower housing 13 with the SC-latch tab 13b and fixed with the bar 13a to the lower housing 13. FIGS. 8A and 8B illustrate the process where the intermediate product is installed with the lower housing 13. FIG. 8A illustrates the process before the bar 13a is attached, while, FIG. 8B shows assembly after the bar 13a is fixed to the housing 13.

The sleeve members, 11f and 12f, each provide a pair of flanges, $11f_1$ and $11f_2$, or $12f_1$ and $12f_2$, between which the projections formed inner side walls and bottom surface of the lower housing 13 are put, which determines the positional relation between the sleeve members, 11f and 12f, and the lower housing 13. Strictly, to fit the bar 13a between the rear surface of the front flange, $11f_1$ or $12f_1$, and the front surface of the projection 13c formed in the lower housing determines the position of the sleeve members, 11f and 12f, with respect to the lower housing 13.

The tip end of the sleeve members, 11f and 12f, extrude into the optical receptacle 24 and the length of the extrusion is necessary to follow the standard of the optical receptacle and the optical connected to be mated with the optical receptacle. The present optical transceiver may follow the standard by fixing the optical units, 11 and 12, to the lower housing 13. In this process, the latch tab 21 and the leaf spring 22 to push out the latch tab 21 outwardly are installed on the side of the optical receptacle 24, which is illustrated in FIGS. 8B and 8A.

(Assembly of the Upper Housing, the Cover and the Grip)

Figure 9:
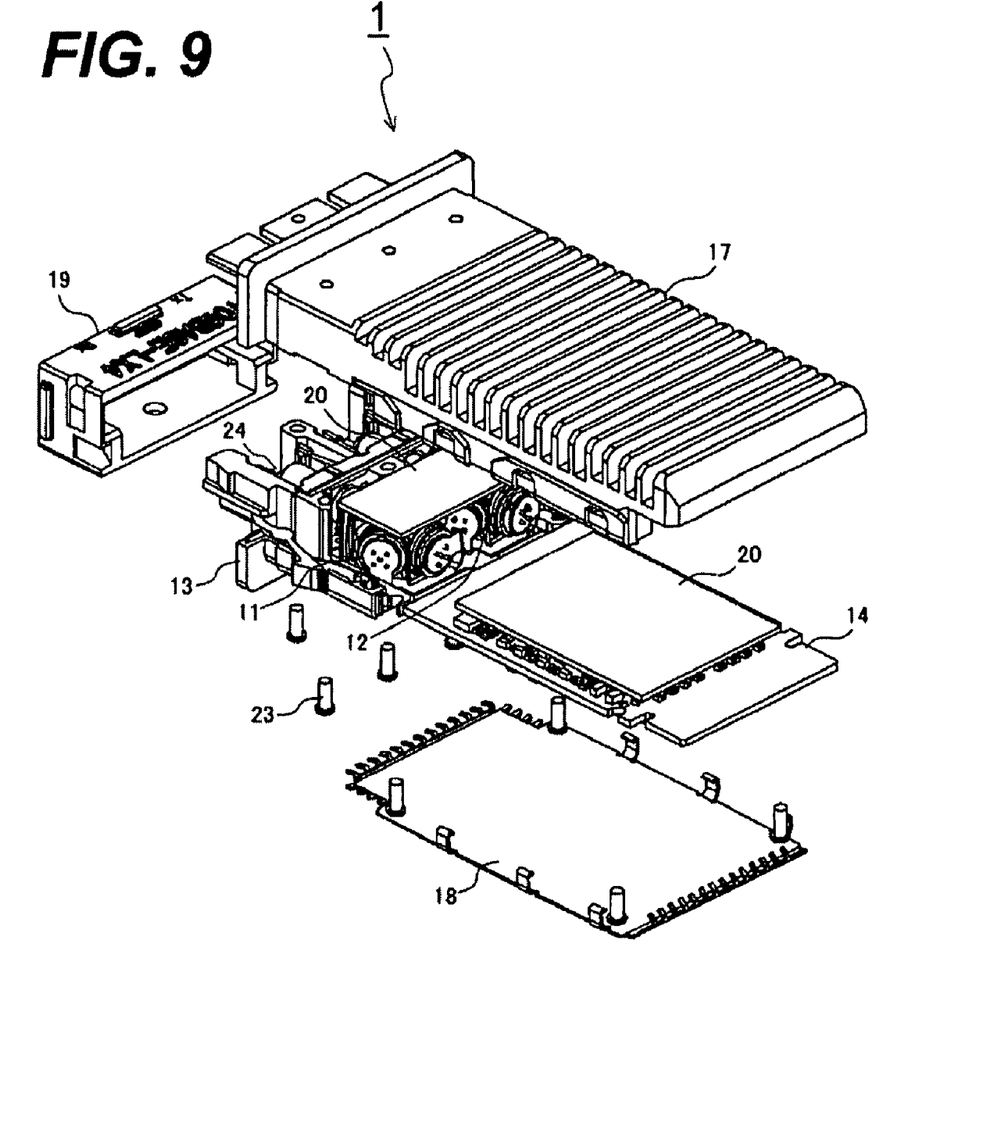
FIG. 9 shows a process to set the intermediate product with the upper housing, the cover, and the grip.

Subsequently, thermal sheets 20 are attached on the electronic devices on the substrate 14 and on the optical units, 11 and 12. Both housings, 13 and 17, are assembled with some screws 23, the meal cover 18 is attached to the lower housing 13, while, the grip 19 is set on the optical receptacle 24. FIG. 9 shows the process to assemble these components with the intermediate product with the optical units, 11 and 12, and the substrate 14.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

We claim:

1. An optical transceiver for converting between a plural optical signals each having a specific wavelength different from each other and a plural electrical signals each corresponding to one of optical signals, the transceiver comprising:
    an optical unit including a plurality of wavelength selective filters and a plurality of optical subassemblies, each wavelength selective filters transmitting one of optical signals having the specific wavelength, each subassemblies facing one of wavelength selective filters;
    a substrate that installs an electronic circuit thereon which is electrically connected to each of the optical subassemblies; and
    a flexible printed circuit board that electrically connects each of the optical subassemblies to the substrate, the flexible printed circuit board including a plurality of branches, an unified portion, and a center portion with a polygonal shape tracing an outer shape of the optical unit, each of the branches extending from each of edges of the polygonal shape and being connected to one of the optical subassemblies, the unified portion extending from one of the edges of the polygonal shape not extending the branches and being connected to the substrate,
    wherein the center portion of the flexible printed circuit board is bonded to the optical unit so as to trace the polygonal shape of the center portion of the flexible printed circuit board with an outer shape of the optical unit.

2. The optical transceiver according to claim 1,
    wherein the flexible printed circuit board provides creases at interfaces between the center portion and each of the branches and at an interface between the center portion and the unified portion.

3. The optical transceiver according to claim 2,
    wherein each of the creases provides a notch in an edge of the flexible printed circuit board.

4. The optical transceiver according to claim 1,
wherein each of the branches provides a round end with a rigid substrate whose shape traces the round end,
wherein the round end and the rigid substrate provides a plurality of via holes each corresponding to one of lead pins provided in the optical subassembly, each lead pin soldered and supported with the rigid substrate.

5. The optical transceiver according to claim 4,
wherein the via holes in the rigid substrate and in the round end of the branch have a prolonged oval shape arched along a circle with a center substantially same as a center of the round end.

6. The optical transceiver according to claim 1,
wherein the flexible printed circuit board has interconnecting patterns grouped into each of the optical subassemblies,
wherein each of the ground patterns of the grouped interconnecting patterns is electrically isolated to each other.

7. An optical transceiver comprising:
a receiver optical unit that includes four ROSAs and first four wavelength selective filters, the receiver optical unit being provided with a receiving optical signal each having one of first four wavelengths different from each other, each of the ROSAs receiving a portion of the optical signal with one of first to fourth wavelengths filtered by one of the first four wavelength selective filters,
a transmitter optical unit that includes four TOSAs and second four wavelength selective filters, the transmitter optical unit providing a transmitting optical signal each having one of second four wavelengths different from each other, one of the second four wavelength selective filters multiplexing a portion of the transmitting optical signal with one of second four wavelengths output from one of four TOSAs;
an electronic circuit installed on a substrate;
a first flexible printed circuit board including a center portion, four branches and a unified portion, the center portion having a first polygonal shape tracing a horizontal section of the receiver optical unit, each of branches extending from one of edges of the first polygonal center portion having a round end electrically connected to one of the ROSAs, the unified portion being connected to the substrate; and
a second flexibly printed circuit board including a center portion, four branches and a unified portion, the center portion having a second polygonal shape tracing a horizontal section of the transmitter optical unit, each of the branches extending one of edges of the second polygonal center portion and having a round end electrically connected to one of the TOSAs, the unified portion being connected to the substrate;
wherein the first polygonal center portion of the first flexible printed circuit board is attached to the receiver optical unit so as to align the polygonal shape of the center portion of the first flexible printed circuit board with the horizontal section of the receiver optical unit, and
wherein the second polygonal center portion of the second flexible printed circuit board is attached to the transmitter optical unit so as to align the polygonal shape of the center portion of the second flexible printed circuit board with the horizontal section of the transmitter optical unit.

* * * * *